United States Patent [19]

Havemann

[11] Patent Number: 4,703,554
[45] Date of Patent: Nov. 3, 1987

[54] TECHNIQUE FOR FABRICATING A SIDEWALL BASE CONTACT WITH EXTRINSIC BASE-ON-INSULATOR

[75] Inventor: Robert H. Havemann, Garland, Tex.

[73] Assignee: Texas Instruments Incorporated, Dallas, Tex.

[21] Appl. No.: 856,848

[22] Filed: Apr. 21, 1986

Related U.S. Application Data

[62] Division of Ser. No. 719,784, Apr. 4, 1985, abandoned.

[51] Int. Cl.$^4$ .................. H01L 21/263; H01L 21/203
[52] U.S. Cl. ........................................ 437/31; 357/34; 437/63; 437/191; 148/DIG. 116
[58] Field of Search ............... 29/571, 576 B, 578, 29/591; 148/1.5, 175; 357/34

[56] References Cited

U.S. PATENT DOCUMENTS 4,101,350  7/1978  Possley et al. ................. 148/175
4,338,138  7/1982  Cavaliere et al. ............... 148/1.5
4,378,630  4/1983  Horng et al. .................... 148/187
4,571,817  2/1986  Birritella et al. ................ 29/576 B
4,615,746  10/1986 Kawakita et al. ................ 148/1.5

Primary Examiner—Upendra Roy
Attorney, Agent, or Firm—Leo N. Heiting; James T. Comfort; Melvin Sharp

[57] ABSTRACT

The disclosure relates to a bipolar transistor having reduced base-collector capacitance and a method of making the transistor by forming a sidewall base contact with polycrystalline silicon-on-insulator. The structure is achieved by using differential oxidation to grow thicker oxide over heavily doped N+ regions in a sacrificial polycrystalline silicon layer with the sidewall base region being protected from doping by a sidewall oxide and limited anneal of the N+ dopant. Both NPN and PNP bipolar transistors with minimum collector-base capacitance can be fabricated using this technique.

21 Claims, 9 Drawing Figures

TECHNIQUE FOR FABRICATING A SIDEWALL BASE CONTACT WITH EXTRINSIC BASE-ON-INSULATOR

This application is a division of application Ser. No. 719,784, filed 4/4/85, now abandoned.

BACKGROUND OF THE INVENTION

1. FIELD OF THE INVENTION

This invention relates to a method for producing semiconductor devices and, more specifically, to a method for reducing the extrinsic base-collector capacitance of such semiconductor devices.

2. BRIEF DESCRIPTION OF THE PRIOR ART

Bipolar transistors as known in the art have an extrinsic base region which contacts an intrinsic base region. The extrinsic base region in NPN transistors is a P+ doped contact which enables contact to the intrinsically doped base of the transistor. When the P+ region is implanted and diffused into the substrate of the transistor structure, the substrate normally being an N-type epitaxial layer, a capacitance associated with the junction formed which is known as a parasitic capacitance is present, this parasitic capacitance being an undesirable but necessary evil in such prior art devices. It is desired to construct a bipolar transistor which will minimize this parasitic capacitance and yet form the required P+ contact to the P-type base region.

SUMMARY OF THE INVENTION

In accordance with the present invention, the above described problem is minimized and there is provided a method fabricating a transistor which reduces the extrinsic base-collector capacitance by forming a sidewall base contact with polycrystalline silicon-on-insulator. The structure is acheived by using differential oxidation to grow thicker oxide over heavily doped N+ regions in a sacrificial polycrystalline silicon layer with the sidewall base region protected from doping by a sidewall oxide and limited anneal of the N+ dopant. Both NPN and PNP bipolar transistors with minimum collector-base capacitance can be fabricated using the above described technique.

DESCRIPTION OF THE PREFERRED EMBODIMENT

A description of the preferred embodiment will now be described with reference to an NPN bipolar transistor, it being understood by those skilled in the art that PNP bipolar transistors can also be fabricated by the techniques described hereinbelow with appropriate known procedural alteration.

Figure 1:
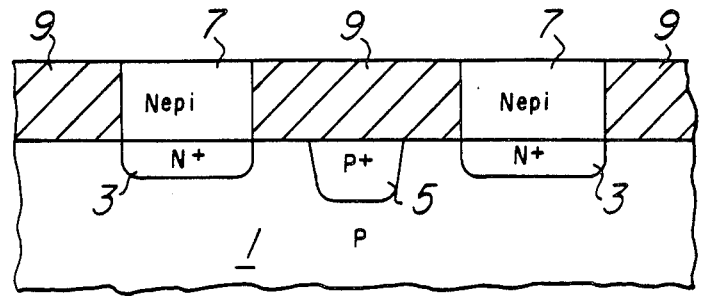
FIGS. 1 to 8 are schematic diagrams of the partially processed substrate at different steps of the process in accordance with the present invention depicting the results of the processing step up to the step illustrated.

Referrring first to FIG. 1, there is shown a P-type silicon substrate 1 having a plurality of N+ subcollectors 3, only two of which are shown, a P+ channel stop 5 between the subcollectors 3 and a plurality of N-type epitaxial layers 7, one such epitaxial layer being formed above each of the subcollectors 3. The P+ channel stop 5 is designed to prevent possible short circuiting between the N+ regions 3. The N-type epitaxial regions 7 are separated from each other by a field oxide 9. This is a standard structure which is obtained during the processing of prior art NPN bipolar transistors. A transistor will be formed in each of the N-type epitaxial regions 7, however, the processing procedure herein will be altered from the prior art subsequent to that shown in FIG. 1 to provide the semiconductor devices with minimized collector-base parasitic capacitance.

Figure 2:
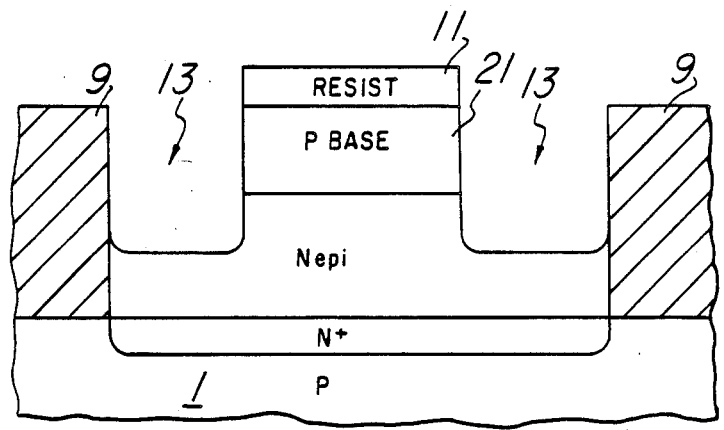
Figure 3:
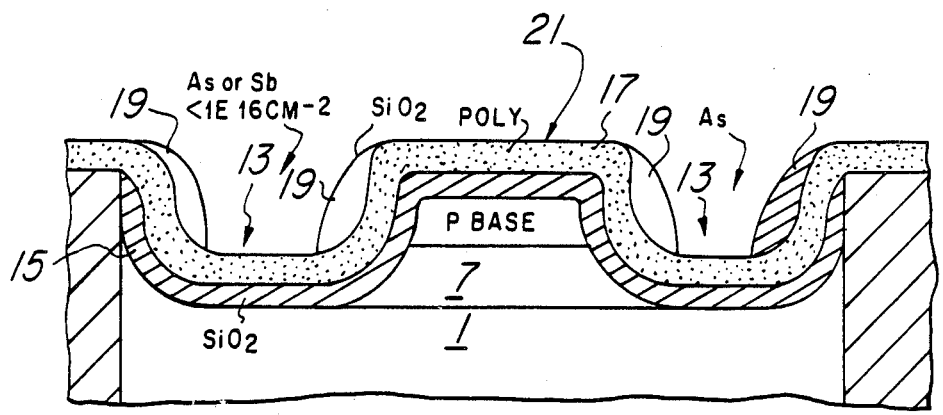

In the fabrication of a semiconductor device from the structure as shown in FIG. 1, in accordance with the present invention, the top surface of the structure as shown in FIG. 1 is doped with a P-type dopant, preferably boron, to form a P-type region at the top surface of each of the N-type epitaxial regions 7. The region 21 wherein the base of each of the transistors is to be formed has a photoresist 11, as shown in FIG. 2, deposited thereover. The structure is then etched with an anisotropic etchant such as Freon-11, to provide the mesa type structure as shown in FIG. 2 with the wells 13 formed by removal of the P-type doped silicon in those regions, thereby removing the P-type dopant deposited in those areas. The photoresist 11 is then removed and processing continues by growing a thin oxide layer of about 500 Angstroms on the exposed silicon regions as shown at 15 in FIG. 3. A polycrystalline silicon layer 17 is then formed over the grown oxide layer 15 of about 1000 Angstroms and a plasma oxide layer of about 3000 Angstroms is then deposited over the polycrystalline silicon layer 17 and then anisotropically etched to form silicon oxide sidewalls 19 on opposite sides of the pedestal 21 in which the base and emitter are to be formed. An N-type dopant, preferably arsenic or antimony, is then implanted into the polycrystalline silicon layer 17 in a concentration of greater than $1 \times 10^{16}$ ions per square centimeter, the dopant entering the polycrystalline layer 17 except in those regions where the silicon oxide layer 19 acts as a mask. It can be seen that the mask exists only on the sidewalls of the wells 13. The resulting structure is that shown in FIG. 3. The structure of FIG. 3 is then annealed in standard manner, preferably at a temperature of about 1000° C. for 30 minutes to activate the dopant.

After the implantation of the dopant and the annealing, the plasma oxide layer 19 which remains is removed, preferably using a 10% hydrogen fluoride solution as an etchant therefore. The exposed polycrystalline silicon layer 17, which now has a N-type dopant therein except in the portions thereof which were disposed beneath the regions where the silicon oxide layers 19 previously existed, is oxidized at a low temperature, preferably about 800° C. Since the rate of oxide growth on the doped polycrystalline silicon is much greater than that of the undoped polycrystalline silicon (approximately 10 to 14:1), the N+ doped regions oxidize much faster than the undoped regions, thereby yielding the structure shown in FIG. 4. It can be seen that the silicon dioxide regions 23 over the field oxide regions 9, the oxide region 25 over the P-type pedestal 21 and the oxide region 27 at the base of each of the wells 13 have grown to a much greater extent than the oxide layer 29 which is at the region where the oxide layer 19 previously existed. In fact, as can be seen, the oxide regions 27 have grown to the point that the polycrystalline silicon regions 17 at both sides of the well are cut off from each other by the silicon oxide region 27.

Figure 4:
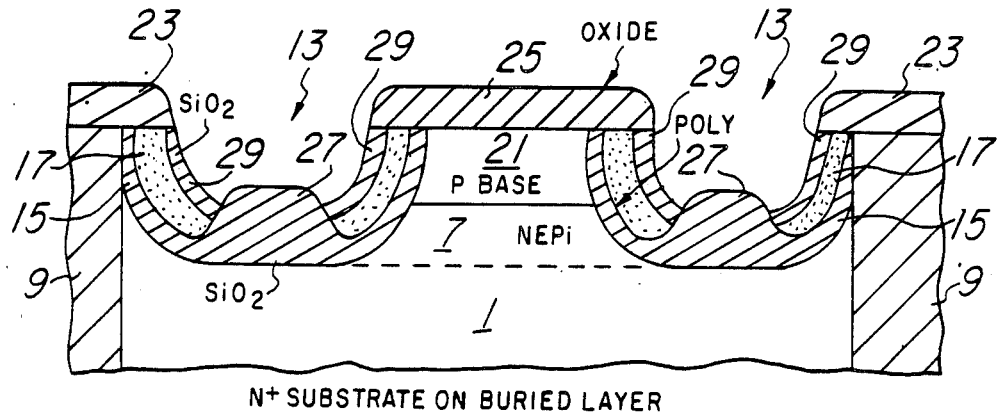

The thin silicon dioxide layer 29 over the undoped polycrystalline silicon layer 17 is then removed by a wet etchant such as 10% HF and the remaining polycrystalline silicon layer 17 is removed with an appropriate etchant such as a plasma etchant with CF$_4$ and oxygen. The thin oxide layer 15 protecting the sidewall of the active base pedestal region 21, which is connected to the silicon oxide region 27 previously formed as seen in FIG. 4, is removed using an etchant such 10% HF immediately prior to the deposition of a thick polycrystalline silicon layer 31 of about 5000 Angstroms, the polycrystalline layer 31 being shown in FIG. 5. This polycrystalline silicon layer 31 acts as the extrinsic base when implanted with boron. Accordingly, boron is implanted into the polycrystalline silicon layer 31 at a concentration of about $1 \times 10^{15}$ ions per cubic centimenter and annealed at 900° C. for approximately 30 minutes to form a P+ polycrystalline silicon layer 31. A thick plasma or CVD oxide 33 having a thickness of about 5000–6000 Angstroms is then deposited over the polycrystalline silicon layer 31 to provide the structure shown in FIG. 5. It can be seen in FIG. 5 that an oxide layer 35 remains in the bottom of each of the wells 13, this oxide layer being a portion of the oxide region 27 as shown in FIG. 4.

Figure 5:
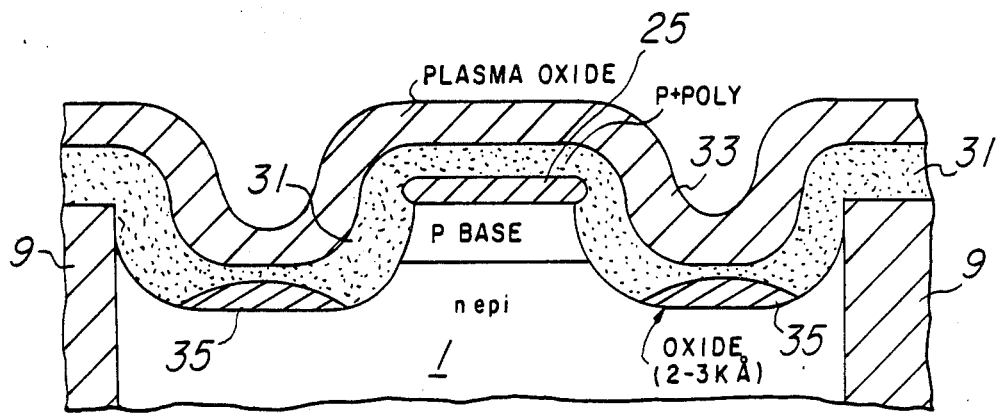
Figure 6:
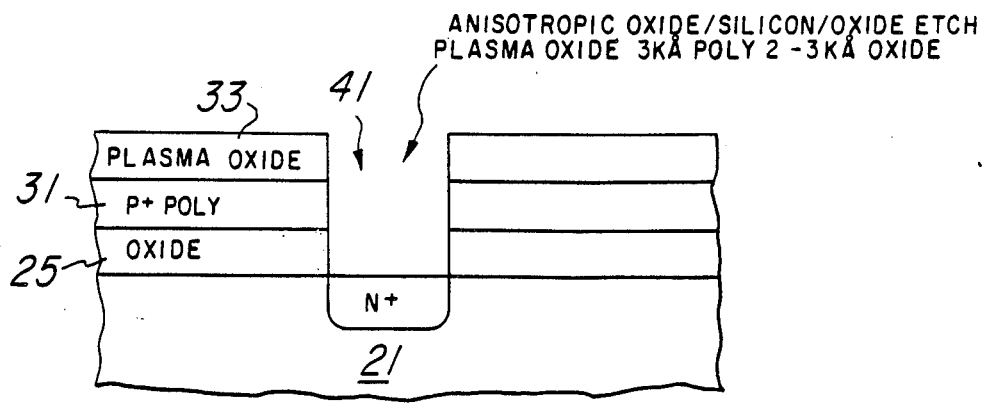
Figure 7:
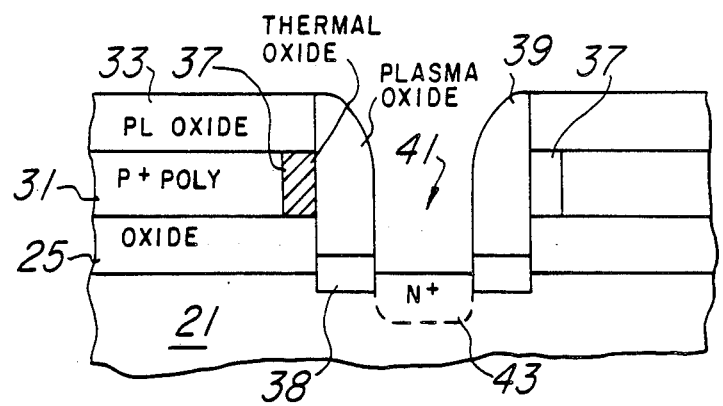
Figure 8:
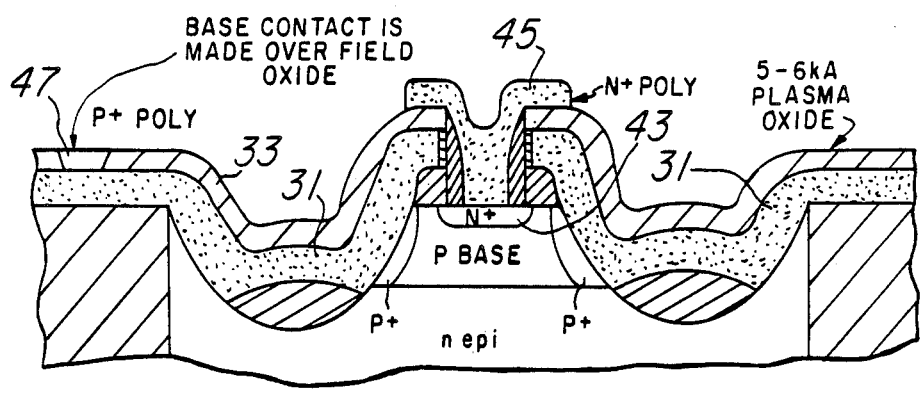
Figure 9:
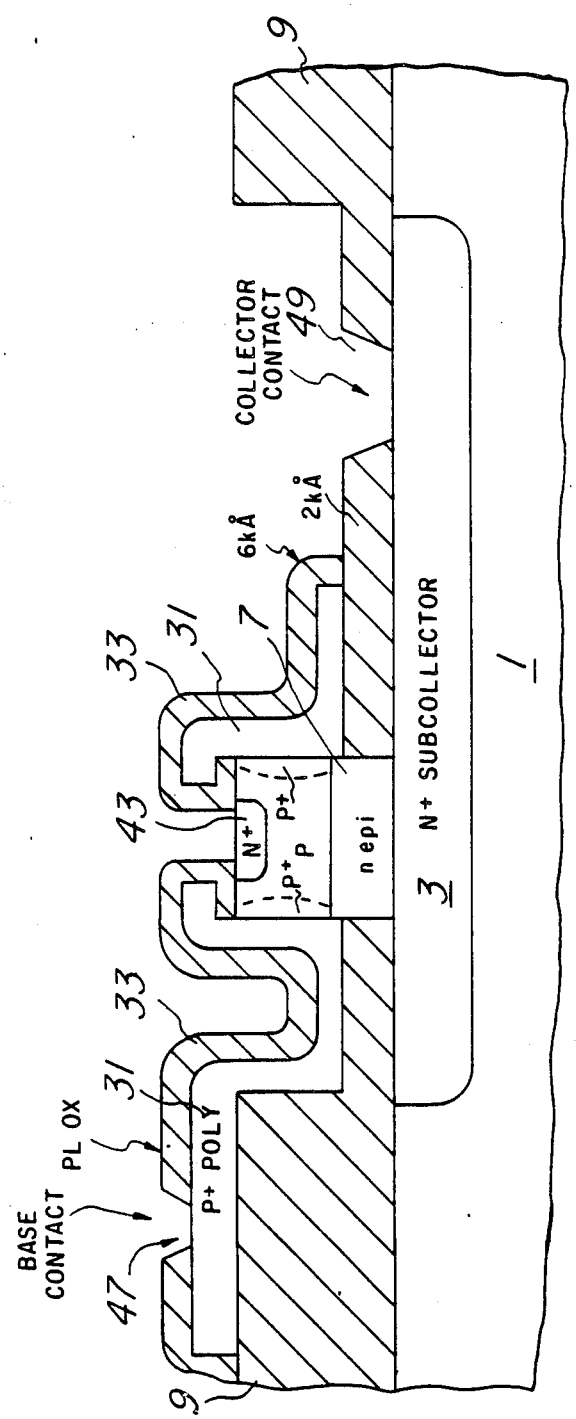
FIG. 9 is a schematic diagram of the semiconductor device formed in accordance with the present invention.

The emitter is formed in the pedestal region 21 at the center of the base region which has already been formed therein. The emitter is patterned by means of a photoresist (not shown) which is placed over the top surface of the structure as shown in FIG. 5 with the regions where the emitter is to be patterned having the photoresist removed therefrom. The structure is then etched using a standard carbon-fluorine etchant such C$_5$F$_{12}$, CF$_4$ or C$_2$F$_6$ which etches through the plasma oxide layer 33 as shown in FIG. 6. An etchant such as Freon-11 is then utilized to etch through the polycrystalline silicon layer 31 in an anisotropic manner as shown in FIG. 6. The final oxide layer is then removed using a carbon fluorine etchant as in the case of the first oxide layer 33 as shown in FIG. 6. The exposed portion of the polycrystalline silicon layer 31 and silicon region 21 in the etched contact 41 are then thermally oxidized to form thin oxide regions 37 and 38. A thick plasma or CVD oxide layer 39 is then deposited on the device and anisotropically etched in a carbon-fluorine etchant (as above) to reopen contact 41 but leave a sidewall oxide within the contact as shown in FIG. 7. These same processing steps as disclosed hereinabove with regard to FIG. 6 and 7 also will take place at a location over each of the N+ regions at a point stepped out from the pedestal 21 except that the oxidizing steps are not necessary to form a collector contact (49 of FIG. 9). A strong N-type dopant such as antimony or arsenic is then implanted in each of the apertures 41 formed for the emitter and the collector contacts and annealed to form N+ regions 43. In addition, an aperture 47 is formed in the oxide layer 33 over the field oxide and over the polycrystalline silicon layer 31 to form a base contact region as shown in FIG. 8. An optimized form of the completed NPN transistor structure is shown in FIG. 9. Alternative structures which employ standard "deep collector" or polycrystalline silicon emitter configurations are also easily realizable using this fabrication technique.

It can see that there has been provided an NPN bipolar transistor having minimized collector-base capacitance by the formation of a sidewall base contact with polycrystalline silicon-on-insulator, this being achieved by the use of differential oxidation to grow thicker oxide over heavily doped N+ regions in a sacrificial polycrystalline silicon layer, the sidewall base region being protected from doping by a sidewall oxide and limited anneal of the N+ dopant.

Though the invention has been described with respect to a specific preferred embodiment thereof, many variations and modifications will immediately become apparent to those skilled in the art. It is therefor the intention that the appended claims be interpreted as broadly as possible in view of the prior art to include all such variations and modifications.

I claim:

1. A method of forming a semiconductor device, comprising the sequential steps of:
   (a) providing a semiconductor body having a layer of semiconductor material of predetermined conductivity type surrounded by an insulating layer,
   (b) forming a pedestal in said semiconductor material of conductivity type opposite to that of said material,
   (c) forming an oxide layer over said semiconductor material and the sidewalls of said pedestal, said oxide layer being thicker over said material than said sidewalls.
   (d) removing said oxide layer over said sidewalls,
   (e) forming an electrical conductor over said substrate coupled to a sidewall of said pedestal, and
   (f) forming an insulating layer over said conductor.
   (g) forming a region of said predetermined conductivity type on the top of said pedestal and spaced from the perimeter edge of said pedestal, and
   (h) forming contacts to said electrical conductor, to said semiconductor material and to said region of said pedestal through said insulating layer.

2. A method as set forth in claim 1 wherein said semiconductor body is a semiconductor substrate having a semiconductor layer thereon of said predetermined conductivity type.

3. A method as set forth in claim 1 wherein said electrical conductor is a polycrystalline silicon layer having a dopant of said opposite conductivity type.

4. A method as set forth in claim 1 wherein said step of forming an electrical conductor comprises the steps of growing an oxide layer over said semiconductor material and said pedestal, forming a polycrystalline silicon layer over said oxide layer, forming an oxide layer on the polycrystalline silicon overlying the sidewalls of said pedestal, doping said layer of polycrystalline silicon with a dopant of said predetermined conductivity type, removing said oxide layer on said sidewall, oxidizing the exposed silicon, removing the oxide over the undoped portion of said silicon layer, said polycrystalline silicon layer thereunder and the oxide layer thereunder, and forming said electrical conductor over the exposed surface of said base.

5. A method as set forth in claim 2 wherein said electrical conductor is a polycrystalline silicon layer having a dopant of said opposite conductivity type.

6. A method as set forth claim 2 wherein said step of forming an electrical conductor comprises the steps of growing an oxide layer over said semiconductor material and said pedestal, forming a polycrystalline silicon layer over said oxide layer, forming an oxide layer on the polycrystalline silicon overlying the sidewalls of said pedestal, doping said layer of polycrystalline silicon with a dopant of said predetermined conductivity type, removing said oxide layer on said sidewall, oxidizing the exposed silicon, removing the oxide over the undoped portion of said silicon layer, said polycrystalline silicon layer thereunder and the oxide layer thereunder, and forming said electrical conductor over the exposed surface of said base.

7. A method as set forth in claim 3 wherein said step of forming an electrical conductor comprises the steps of growing a oxide layer over said semiconductor material and said pedestal, forming a polycrystalline silicon layer over said oxide layer, forming an oxide layer on the polycrystalline silicon overlying the sidewalls of said pedestal, doping said layer of polycrystalline silicon with a dopant of said predetermined conductivity type, removing said oxide layer on said sidewall, oxidizing the exposed silicon, removing the oxide over the undoped portion of said silicon layer, said polycrystalline silicon layer thereunder and the oxide layer thereunder, and forming said electrical conductor over the exposed surface of said base.

8. A method as set forth in claim 5 wherein said step of forming an electrical conductor comprises the steps of growing an oxide layer over said semiconductor material and said pedestal, forming a polycrystalline silicon layer over said oxide layer, forming an oxide layer on the polycrystalline silicon overlying the sidewalls of said pedestal, doping said layer of polycrystalline silicon with a dopant of said predetermined conductivity type, removing said oxide layer on said sidewall, oxidizing the exposed silicon, removing the oxide over the undoped portion of said silicon layer, said polycrystalline silicon layer thereunder and the oxide layer thereunder, and forming said electrical conductor over the exposed surface of said base.

9. A method of forming a semiconductor device, comprising the sequential steps of:
  (a) providing a semiconductor body having a layer of semiconductor material of predetermined conductivity type surrounded by an insulating layer,
  (b) forming a pedestal in said semiconductor material of conductivity type opposite to that of said material,
  (c) growing an oxide layer over said semiconductor material and said pedestal,
  (d) forming a polycrystalline silicon layer over said oxide layer,
  (e) forming an oxide layer on the polycrystalline silicon overlying the sidewalls of said pedestal,
  (f) doping said layer of polycrystalline silicon with a dopant of said predetermined conductivity type,
  (g) removing said oxide layer on said sidewall,
  (h) oxidizing the exposed silicon,
  (i) removing the oxide over the undoped portion of said silicon layer, said polycrystalline silicon layer thereunder and the oxide layer thereunder,
  (j) forming said electrical conductor over the exposed surface of said body,
  (k) forming an insulating layer over said conductor,
  (l) forming a region on the top of said pedestal of said predetermined conductivity type, and
  (m) forming contacts to said electrical conductor, to said semiconductor material and to said region of said pedestal through said insulating layer.

10. A method of forming a semiconductor device, comprising the sequential steps of:
  (a) providing a semiconductor substrate having a semiconductor layer thereon of a predetermined conductivity type and having a further layer of semiconductor material of predetermined conductivity type surrounded by an insulating layer,
  (b) forming a pedestal in said semiconductor material of conductivity type opposite to that of said material,
  (c) growing an oxide layer over said semiconductor material and said pedestal,
  (d) forming a polycrystalline silicon layer over said oxide layer,
  (e) forming an oxide layer on the polycrystalline silicon overlying the sidewalls of said pedestal,
  (f) doping said layer of polycrystalline silicon with a dopant of said predetermined conductivity type,
  (g) removing said oxide layer on said sidewall,
  (h) oxidizing the exposed silicon,
  (i) removing the oxide over the undoped portion of said silicon layer, said polycrystalline silicon layer thereunder and the oxide layer thereunder,
  (j) forming said electrical conductor over the exposed surface of said semiconductor substrate.
  (k) forming an insulating layer over said conductor,
  (l) forming a region on the top of said pedestal of said predetermined conductivity type, and
  (m) forming contacts to said electrical conductor, to said semiconductor material and to said region of said pedestal through said insulating layer.

11. A method of forming a semiconductor device, comprising the sequential steps of:
  (a) providing a semiconductor body having a layer of semiconductor material of predetermined conductivity type surrounded by an insulating layer,
  (b) forming a pedestal in said semiconductor material of conductivity type opposite to that of said material,
  (c) growing an oxide layer over said semiconductor material and said pedestal,
  (d) forming a polycrystalline silicon layer over said oxide layer,
  (e) forming an oxide layer on the polycrystalline silicon overlying the sidewalls of said pedestal,
  (f) doping said layer of polycrystalline silicon with a dopant of said opposite conductivity type,
  (g) removing said oxide layer on said sidewall,
  (h) oxidizing the exposed silicon,
  (i) removing the oxide over the undoped portion of said silicon layer, said polycrystalline silicon layer thereunder and the oxide layer thereunder,
  (j) forming said electrical conductor over the exposed surface of said body,
  (k) forming an insulating layer over said conductor,
  (l) forming a region on the top of said pedestal of said predetermined conductivity type, and
  (m) forming contacts to said electrical conductor, to said semiconductor material and to said region of said pedestal through said insulating layer.

12. A method of forming a semiconductor device, comprising the sequential steps of:
  (a) providing a semiconductor substrate having a semiconductor layer thereon of a predetermined conductivity type and having a further layer of semiconductor material of predetermined conductivity type surrounded by an insulating layer,
  (b) forming a pedestal in said semiconductor material of conductivity type opposite to that of said material,
  (c) growing an oxide layer over said semiconductor material and said pedestal, (d) forming a polycrystalline silicon layer over said oxide layer, (e) forming an oxide layer on the polycrystalline silicon overlying the sidewalls of said pedestal, (f) doping said layer of polycrystalline silicon with a dopant of said predetermined conductivity type, (g) removing said oxide layer on said sidewall, (h) oxidizing the exposed silicon, (i) removing the oxide over the undoped portion of said silicon layer, said polycrystalline silicon layer thereunder and the oxide layer thereunder, (j) forming said electrical conductor over the exposed surface of said semiconductor substrate, (k) forming an insulating layer over said conductor, (l) forming a region on the top of said pedestal of said predetermined conductivity type, and (m) forming contacts to said electrical conductor, to said semiconductor material and to said region of said pedestal through said insulating layer.

13. A method of forming a bipolar transistor, comprising the steps of:

(a) providing a substrate having a semiconductor surface layer of a first conductivity type on portions thereof:

(b) forming a plurality of mesas of a second conductivity type adjacent to exposed portions of said layer of said first conductivity type, said second type regions defining base regions and said first type regions defining collector regions:

(c) forming a protective layer comprising oxides over exposed portions of said collector and base regions:

(d) depositing a sacrificial polysilicon layer over said protective oxide layer;

(e) implanting said sacrificial polysilicon layer to provide a heavy dopant concentration in relatively horizontal portions thereof and not in more vertical portions thereof;

(f) selectively oxidizing said polysilicon layer to form a thick oxide in said relatively horizontal portions thereof and not in said more vertical portions thereof;

(g) removing remaining portions of said sacrificial polysilicon layer;

(h) removing exposed portions of said protective oxide layer; and (i) depositing a further conductive layer overall, whereby said further conductive layer makes electrical contact to the sidewalls of portions of said base regions to form a base contact.

14. The method of claim 13, wherein (e) said step of implanting relatively horizontal portions of said sacrificial polysilicon layer and not more vertical portions thereof comprises the substeps of:

i. forming sidewall filaments on said sacrificial polysilicon layer.

ii. and then implanting said polysilicon layer, whereby said filaments protect said relatively vertical portions of said sacrificial polysilicon layer from said implantation.

15. The method of claim 13, wherein said first conductivity type is n-type.

16. The method of claim 13, wherein said step of implanting said sacrificial polysilicon layer comprises implantation with a dopant selected from the group consisting of arsenic and antimony, at a dose greater than 1E16 cm$^{-2}$.

17. The method of claim 13, wherein (f) said step of selectively oxidizing said sacrificial polysilicon layer comprises the substeps of:

i. selectively oxidizing said sacrificial polysilicon layer so that a thicker oxide is formed on more highly doped portions of said sacrificial polysilicon layer and a thinner oxide is formed on less highly doped portions thereof, and then ii. isotropically etching oxides formed by said differential oxidation step iii. so that said thinner oxides formed on less highly doped portions of said sacrificial polysilicon are entirely removed, while said thicker oxides formed on more heavily doped portions of said polysilicon are not entirely removed.

18. The method of claim 13, wherein (a) said step of providing a semiconductor substrate provides a semiconductor substrate which includes, beneath said first conductivity type region, a buried diffusion which is also of said first conductivity type and is much more heavily doped than said first conductivity type region, whereby said more heavily doped buried diffusion provides a contact to an active bipolar device.

19. The method of claim 13, wherein said step (i) of depositing a further conductive layer deposits polysilicon.

20. The method of claim 18, wherein said semiconductor substrate has said heavily doped buried diffusions of said first conductivity types only under predetermined active device regions, and said active device regions are laterally separated one from another by a thick dielectric layer on the surface of said substrate.

21. The method of claim 20, wherein said thick dielectric layer has channel stops of said second conductivity type thereunder, laterally separating said active device regions one from another.

* * * * *